United States Patent [19]

Ito et al.

[11] Patent Number: 4,543,707
[45] Date of Patent: Oct. 1, 1985

[54] METHOD OF FORMING THROUGH HOLES BY DIFFERENTIAL ETCHING OF STACKED SILICON OXYNITRIDE LAYERS

[75] Inventors: Toshiyo Ito, Yokohama; Jiro Ohshima, Kawasaki, both of Japan

[73] Assignee: Kabushiki Kaisha, Japan

[21] Appl. No.: 626,386

[22] Filed: Jun. 29, 1984

[30] Foreign Application Priority Data

Jun. 30, 1983 [JP] Japan ................. 58-117083

[51] Int. Cl.[4] .................... H07L 21/90; B44C 1/22
[52] U.S. Cl. ..................... 29/578; 29/576 J; 148/1.5; 148/187; 148/DIG. 82; 156/653; 357/54
[58] Field of Search ........... 29/576 E, 576 J, 578; 148/1.5, 187; 357/54; 156/653

[56] References Cited

U.S. PATENT DOCUMENTS

| | | | |
|---|---|---|---|
| 4,174,251 | 11/1979 | Paschke | 156/643 |
| 4,257,832 | 3/1981 | Schwabe et al. | 148/187 |
| 4,334,349 | 6/1982 | Aoyama et al. | 156/653 |
| 4,337,115 | 6/1982 | Ikeda et al. | 357/54 |
| 4,363,868 | 12/1982 | Takasaki et al. | 156/643 |
| 4,484,978 | 11/1984 | Keyser | 156/643 |
| 4,484,979 | 11/1984 | Stocker | 156/643 |

FOREIGN PATENT DOCUMENTS 0040260 4/1981 Japan ........................ 29/576 J

OTHER PUBLICATIONS

Nakata et al., Jap. Jour. Appl. Phy. 22, (Jan. 1983), 188.

Primary Examiner—Upendra Roy
Attorney, Agent, or Firm—Finnegan, Henderson, Farabow, Garrett & Dunner

[57] ABSTRACT

A process of manufacturing a semiconductor device by which a through hole such as contact hole with an obtuse opening edge can be formed in an insulation or passivation layer. At least two silicon oxynitride layers in which the nitrogen to oxygen ratio differs from each other are formed on a semiconductor substrate. The etching rate of the top layer is greater than that of the second layer from the top. The stacked silicon oxynitride layers are then selectively etched to form a through hole with an obtuse opening edge.

3 Claims, 7 Drawing Figures

F I G. 3
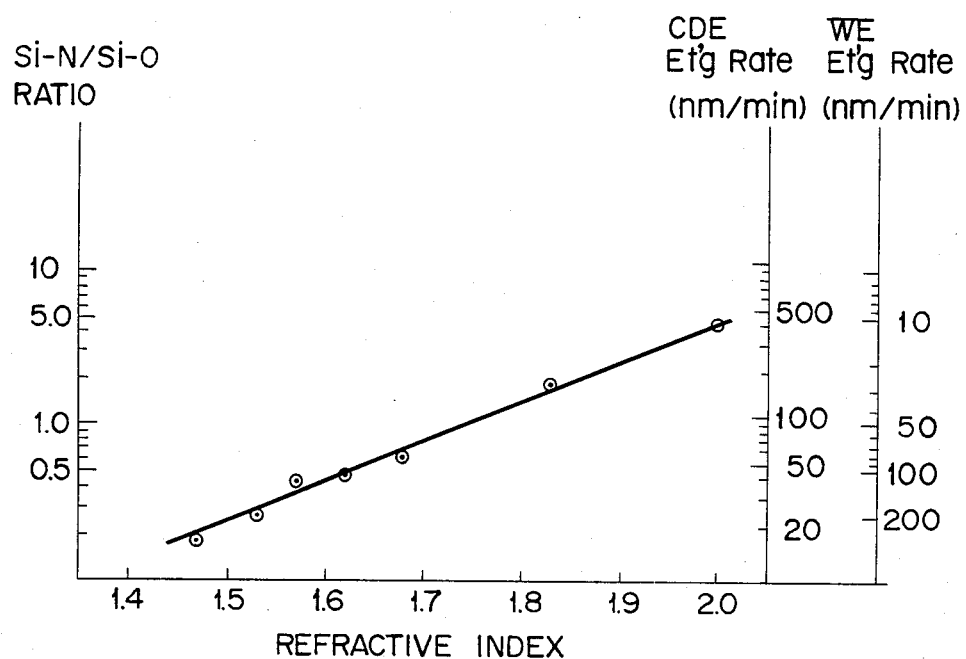
F I G. 4
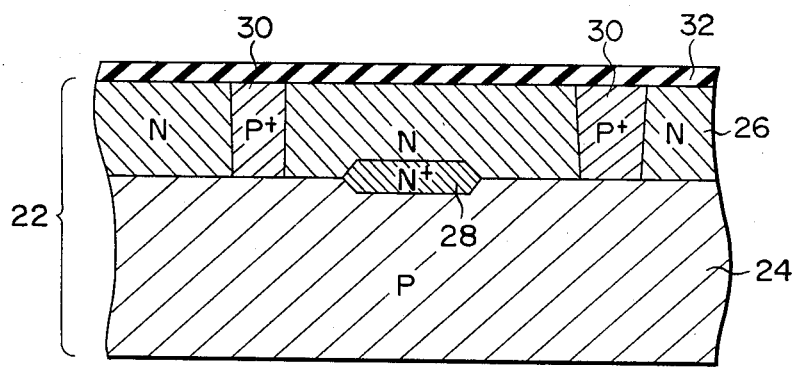

METHOD OF FORMING THROUGH HOLES BY DIFFERENTIAL ETCHING OF STACKED SILICON OXYNITRIDE LAYERS

BACKGROUND OF THE INVENTION

I. Field of the Invention

This invention relates to a process of manufacturing a semiconductor device, and more particularly, this invention relates to a process of manufacturing a semiconductor device in which a through hole such as a so-called contact hole is formed in a layer on a semiconductor substrate.

II. Description of the Prior Art

In a conventional semiconductor device, a layer or a film such as a silicon dioxide layer, borosilicate glass layer and phosphosilicate glass layer is usually formed on the semiconductor substrate for the purpose of insulation and/or passivation of the device. In the layer on the semiconductor substrate, a through hole such as a so-called contact hole is usually formed. After the through hole is formed, a further layer such as an aluminum wiring layer is deposited on the structure. As shown in FIG. 1, if the through hole 10 formed in a layer 12 on a semiconductor substrate 14 has a sharp opening edge 16, the additional layer 18 formed on the layer 12 and in the through hole 10 tends to be cut. As a result, a short circuit or other malfunctions tend to occur. Thus, it is preferable that the through hole 10 have an obtuse opening edge 20 as shown in FIG. 2.

A conventional semiconductor device such as a bipolar transistor usually has a multilayer structure consisting of, from the bottom layer, a silicon dioxide layer, a hybrid layer of borosilicate glass (BSG) and undoped silicon dioxide, and a phosphosilicate glass (PSG) layer on the semicondcutor substrate. A through hole is formed in the multilayer structure by a selective wet etching using a hydrofluoric acid-based etching solution. The etching rate of the PSG layer (the top layer) is faster than the hybrid layer and silicon dioxide layer under the PSG layer. As a result, an obtuse opening edge is obtained since the sharp opening edge is etched off while the lower layers are etched.

However, PSG has drawbacks in that it corrodes the aluminum wiring, and the phosphorus in the PSG uncontrollably migrates into the semiconductor substrate to change the electric characteristics of the device. Further, with the high integration of the device, in lieu of the thermal diffusion from PSG or BSG, an ion implantation technique which has higher controllability comes to be used to form impurity region in the semicondcutor substrate. Thus, the PSG layer and BSG layer are usually not formed in the up-to-date LSI. In addition, chemical dry etching technique using CF4 and O2 gas has come to be used in lieu of the wet etching technique since the former has a high controllability. The etching rate of PSG by chemical dry etching is about the same as that of BSG or a silicon dioxide layer. In summary, a through hole with an obtuse opening edge is not obtained in an up-to-date semiconductor device since PSG and BSG are not used and since chemical dry ething is used instead of wet etching. The need continues to exist to form a through hole with an obtuse opening edge in an up-to-date semiconductor device in which no PSG layer is used and/or to form the same using the chemical dry etching technique.

SUMMARY OF THE INVENTION

It is, therefore, the object of the present invention to provide a process of manufacturing a semiconductor device by which a through hole with an obtuse opening edge can be formed in the insulation or passivation layer.

In the process of the present invention, at least two silicon oxynitride layers in which the nitrogen to oxygen ratio differ with each other are stacked on a semiconductor substrate. The etching rate of the top layer must be faster than that of the second layer from the top (hereinafter referred to simply as the second layer). Then an selective etching is performed to form a through hole in the stacked silicon oxynitride layer.

According to the present invention, a through hole with an obtuse opening edge can be formed in the silicon oxynitride layers. As a result, a layer such as an aluminum wiring layer formed on the wall of the through hole may not be cut. Further, since silicon oxynitride has a quite high dielectric constant, a high field threshold voltage ($V_{th}$) can be obtained, that is, good insulation can be provided by the silicon oxynitride. In addition, silicon oxynitride acts as a strong barrier against contaminants such as water, alkali ions and other chemicals. Therefore, good passivation of the device is brought about by the silicon oxynitride layer.

BRIEF DESCRIPTION OF THE DRAWINGS

FIG. 3 shows the relationship among the N/O ratio, the etching rate by chemical dry etching and by wet etching, and the refractive index of silicon oxynitride; and FIGS. 4 to 7 are sectional views for explaining the process of the present invention.

DETAILED DESCRIPTION OF THE PREFERRED EMBODIMENTS

Figure 1:
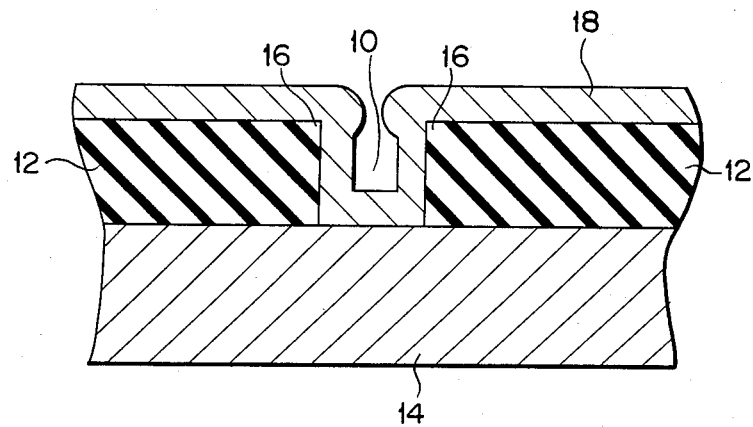
FIG. 1 schematically shows the undesirable shape of a through hole.
Figure 2:
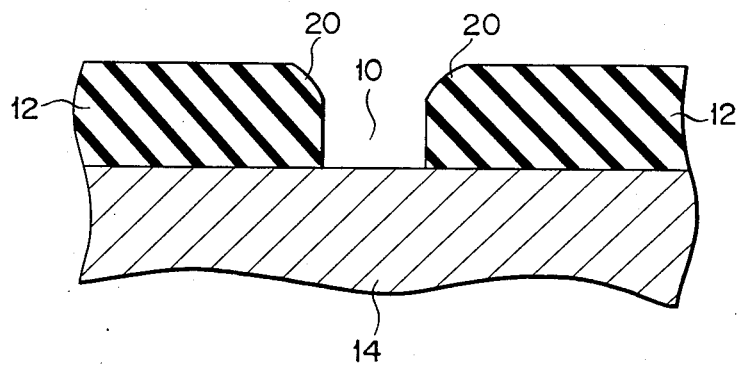
FIG. 2 schematically shows the desirable shape of a through hole.

Silicon oxynitride ($SiO_xN_y$) has a quite high dielectric constant and can act as a good barrier against contaminants such as alkali ions. Therefore, it is suitable to use it as an insulation layer in a semicondcutor device. The present inventors discovered that the etching rate of a silicon oxynitride varies depending on its nitrogen to oxygen ratio (N/O atomic ratio). The relationship between the N/O ratio (ratio of the number of nitrogen atoms to the number of oxygen atoms in a silicon oxynitride) and the etching rate by chemical dry etching (CDE) using $CF_4$ gas (and $O_2$ gas) or wet etching (WE) using an HF-based etching solution is shown in the following table. The N/O ratio was determined by chemical analysis and an X-ray micro analyzer. In the table, the refractive index (n) is also shown.

TABLE

| N/O | CDE (nm/min.) | WE (nm/min.) | n |
| --- | --- | --- | --- |
| 0.274 | 24 | 180 | 1.53 |
| 0.428 | 36 | 145 | 1.57 |
| 0.451 | 60 | 110 | 1.63 |

As can be seen from the table, N/O ratio is proportional (although not directly proportional) to the etching rate by chemical dry etching, and is inversely proportional to the etching rate by wet etching. Therefore, by changing the N/O ratio in a silicon oxynitride, it is possible to controllably change the etching rate of the silicon oxynitride. This invention utilizes this property of silicon oxynitride. If two or more silicon oxynitride layers are stacked and the N/O ratios thereof are different from each other such that the etching rate of the top layer is faster than that of the second layer, a through hole with an obtuse opening edge can be obtained by selectively etching the stacked layers. This is because that the sharp edge of the through hole which is formed in the top layer is etched off when the layer or layers under the top layer are etched. Since the N/O ratio is also roughly proportional to the refractive index, the N/O ratio can be determined by measuring the refractive index of the silicon oxynitride layer.

A further experiment was conducted to determine the relationship among the N/O ratio, etching rate by CDE or WE, and the refractive index. The results are shown in FIG. 3. This time, the N/O ratio was determined by an infrared absorption spectrum and was expressed as the ratio of the peak height of Si-N bond to Si-O bond.

The process of the present invention can be applied to any kinds of semiconductor devices, so that the semiconductor substrate on which silicon oxynitride layers are formed may be of any type.

On the semiconductor substrate, at least two silicon oxynitride layers are stacked. The N/O ratio in each layer should differ from each other such that the etching rate of the top layer is faster than that of the second layer. A silicon oxynitride layer can be formed by a well-known plasma chemical vapor deposition (plasma CVD) technique or a low pressure chemical vapor deposition technique using as a material $N_2O$ gas or $NH_3$ gas and $SiH_4$ gas. Plasma CVD is preferred since the operation temperature is much lower than that of low pressure CVD. The flow rate of the material gases can be appropriately determined. For example, the flow rate of the $N_2O$ gas may be 1,900 ml/min. and that of the $SiH_4$ gas may be 45 to 100 ml/min. The operation temperature in plasma CVD may be, for example, about 380° C., and in a low pressure CVD it may be, for example, about 800° C. The N/O ratio, and in turn the etching rate of the silicon oxynitride layer can be changed by changing the ratio of the flow rate of the material gases. When the flow rate of $N_2O$ is fixed, the N/O ratio increases with the flow rate of $SiH_4$. Thus, if chemical dry etching is employed, the $SiH_4$ gas flow rate should be faster in forming the top layer than in forming the second layer since the etching rate by chemical dry ething increases as the N/O ratio increases. However, if the flow rate of $SiH_4$ is too high, the resulting silicon oxynitride contains too much silicon, which degrades the electric characteristics of the device. The preferable range of the refractive index of the silicon oxynitride layer may be about 1.5 to 1.65. The N/O ratio can also be changed by changing the operation power of the CVD apparatus employed. The preferred power range of the apparatus may be 100 to 500 miliampere. The N/O ratio decreases as the operation power increases. The N/O ratio may also vary depending on the amount of hydrogen in the silicon oxynitride, which is inevitably contained in a trace amount. The thickness of the silicon oxynitride may be appropriately selected depending on the type of the semiconductor device, but usually is about 100 nm to 1000 nm.

As described above, silicon oxynitride layers in which the N/O ratio differs from each other can be obtained by changing the flow rate of the material gas and the operation power. Thus, a plurality of silicon oxynitride layers in which N/O ratio differs with each other can be stacked by merely changing the flow rate of the material gas and the operation power in a single CVD process, which is very convenient.

If the N/O ratio increases to an extremely high value, it becomes silicon nitride. Similarly, if the N/O ratio decreases to almost zero, it becomes silicon oxide. Thus, the term "silicon oxynitride" in this specification and the appended claims should be interpreted as including silicon nitride and silicon oxide.

The essential requirement for stacking the silicon oxynitride layer is that the etching rate of the top layer be faster than that of the second layer. A third layer may be formed but is not always necessary. If three or more layers are formed, it is preferable to form a layer under the second layer, in which the etching rate is faster than that of the second layer. By so doing, a through hole with a smaller diameter can be formed, which is favorable to the construction of highly integrated circuits.

After the silicon oxynitride layers are stacked on the semiconductor substrate, the stacked layers are then selectively etched to form a through hole therein. The etching can be conducted by a well-known chemical dry etching technique using $CF_4$ gas (and $O_2$ gas) or by a well-known wet etching using an HF-based solution. Chemical dry etching is preferred to wet etching since the former has better controllability. By selective etching, a through hole is formed in the stacked layers. The through hole has an obtuse opening edge since the etching rate of the top layer is greater than that of the second layer and so the sharp opening edge is etched off during the second layer or an additional layer under the second layer is etched. The through hole may be a contact hole which connects an impurity region in the semiconductor substrate and a wiring formed on the silicon oxynitride layers through an electrode layer formed in the contact hole.

After forming the through hole, an additional layer such as aluminum wiring layer is deposited on the structure. Since the through hole has an obtuse edge, the additional layer is unlikely to be cut. Thus, a semiconductor device free from short circuit or other disorders brought about by the sharp edge of the through hole can be obtained.

EXAMPLE

This invention can be more readily understood by the following example. Although in this example, the present invention is applied to the manufacture of an NPN bipolar transistor, it is obvious that the present invention is not limited to it. Since the manufacturing steps before the formation of the silicon oxynitride layers are conventional and well-known in the art, the detailed description thereof will be omitted.

Figure 5:
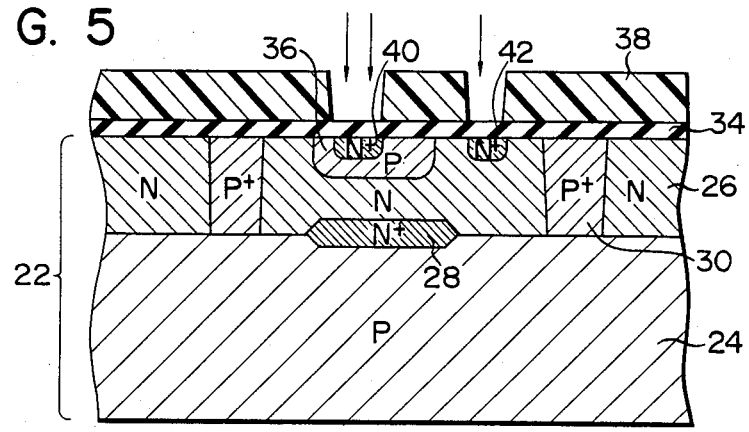
Figure 6:
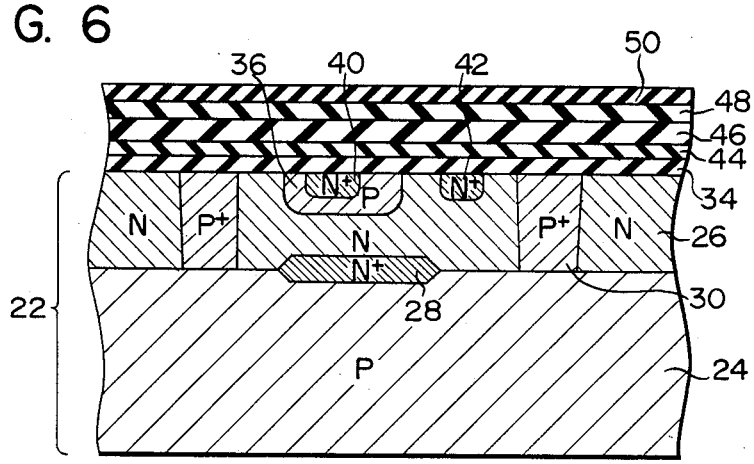

A semiconductor substrate 22 (see FIG. 4) including a P-type impurity region 24, an N-type epitaxial impurity region 26 formed on the P-type impurity region 24, and an $N^+$-type impurity region 28 buried at the interface between the P-type impurity region 24 and N-type impurity region 26 was prepared according to a conventional manner. In the epitaxial impurity region 26, $P^+$-type isolation regions 30 were formed by ion implantation. The mask used for the ion implantation was removed and a silicon dioxide layer 32 of about 150 nm thickness was formed on the N-type epitaxial impurity region 26 (FIG. 4). Using a selectively etched photoresist film as a mask, a base region 36 was formed by ion implantation and subsequent annealing. The silicon dioxide layer 32 was removed and a fresh silicon dioxide layer 34 was formed in place of it. Using a selectively etched photoresist film 38 as a mask, N+-type regions 40 and 42 were formed by ion implantation and subsequent annealing (FIG. 5). The above-mentioned steps are conventional and well-known.

On the silicon dioxide layer 34, four silicon oxynitride layers 44, 46, 48 and 50 were stacked by a single plasma CVD process using $N_2O$ gas and $SiH_4$ gas. These layers were formed for the purpose of insulation and passivation of the device. The N/O ratio expressed as the ratio of peak height of Si-N bond to Si-O bond in the infrared spectrum of the layers 44, 46, 48 and 50 were 0.2 (refractive index (n) of 1.47), 0.5 (n=1.62), 0.28 (n=1.53), and 5.00 (n=2.00), respectively. The thickness of the layers 44, 46, 48 and 50 were 100 nm, 200 nm, 100 nm and 100 nm, respectively. The flow rate of $N_2O$ gas was fixed to 1,900 ml/min. in the layers 44, 46, 48, while that of $SiH_4$ was changed. More specifically, the flow rates of $SiH_4$ gas employed for forming the silicon oxynitride layers 44, 46 and 48 were 35 ml/min., 100 ml/min., 45 ml/min., respectively. The power of the CVD apparatus was 100 miliampere.

In forming the layer 50, the flow rates of $SiH_4$ gas employed was 200 ml/min., the flow rates of $NH_3$ gas employed was 1820 ml/min., and the power of the CVD apparatus was 250 miliampere.

Figure 7:
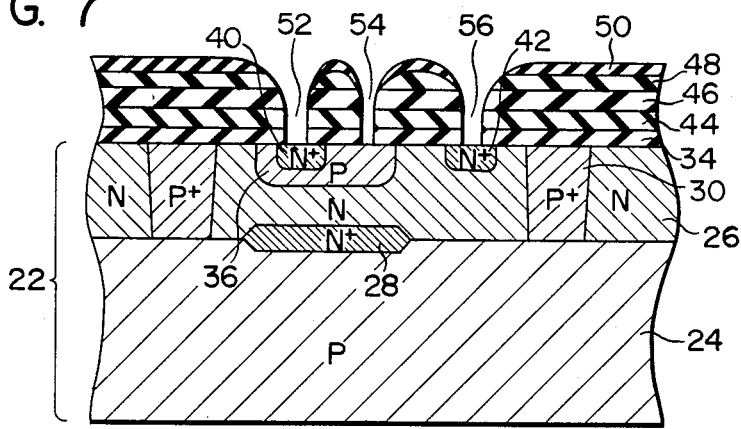

A selectively etched photoresist film (not shown) was formed on the top layer 50. Using this photoresist film as a mask, the silicon oxynitride layers were selectively etched by conventional chemical dry etching using $CF_4$ gas (flow rate of 300 ml/min.) and $O_2$ gas (flow rate of 100 ml/min.). As a result, contact holes 52, 54, 56 with an obtuse opening edge were formed in the silicon oxynitride layers as shown in FIG. 7.

The thus obtained structure can then be processed in a conventional manner. An aluminum wiring layer will be formed on the top layer 50 and in the contact holes 52, 54 and 56, which contacts the N+-type region 40, 42, and base region 36. Since the contact holes formed according to the present invention have obtuse opening edges, the aluminum wiring layer formed thereon is unlikely to be cut.

What is claimed is:

1. A process of producing a semiconductor device comprising the steps of:
    stacking at least two silicon oxynitride layers of which nitrogen to oxygen ratio differs from each other on a semiconductor substrate, in which the etching rate of the top layer is faster than that of the second layer from the top; and
    selectively etching the stacked silicon oxynitride layers to form a through hole in the same, thereby providing a through hole with an obtuse opening edge.

2. The process of claim 1, wherein the nitrogen to oxygen ratio of the top layer is larger than that of the second layer from the top, and the etching is conducted by chemical dry etching.

3. The process of claim 1, wherein the nitrogen to oxygen ratio of the top layer is smaller than that of the second layer from the top, and the etching is conducted by wet etching using an HF-based etching solution.

* * * * *

UNITED STATES PATENT AND TRADEMARK OFFICE
CERTIFICATE OF CORRECTION

PATENT NO. : 4,543,707
DATED : October 1, 1985
INVENTOR(S) : Toshiyo Ito et al.

It is certified that error appears in the above-identified patent and that said Letters Patent is hereby corrected as shown below:

On the cover page please make the following change:

[73] "Kabushiki Kaisha" should be -- Kabushiki Kaisha Toshiba --.

Signed and Sealed this

Fourteenth Day of January 1986

[SEAL]

Attest:

Attesting Officer

DONALD J. QUIGG

Commissioner of Patents and Trademarks